(12) United States Patent
Yamase et al.

(10) Patent No.: US 8,593,315 B2
(45) Date of Patent: Nov. 26, 2013

(54) A/D CONVERSION DEVICE AND A/D CONVERSION CORRECTING METHOD

(75) Inventors: Tomoyuki Yamase, Tokyo (JP); Hidemi Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/577,845

(22) PCT Filed: Jan. 20, 2011

(86) PCT No.: PCT/JP2011/051534
§ 371 (c)(1),
(2), (4) Date: Aug. 8, 2012

(87) PCT Pub. No.: WO2011/099367
PCT Pub. Date: Aug. 18, 2011

(65) Prior Publication Data
US 2013/0027236 A1    Jan. 31, 2013

(30) Foreign Application Priority Data

Feb. 9, 2010  (JP) ................................ 2010-026068

(51) Int. Cl.
*H03M 1/06*   (2006.01)
(52) U.S. Cl.
USPC ........... 341/118; 341/122; 341/155; 714/776; 714/748; 714/746; 714/700; 714/756; 714/792; 714/752; 714/753; 714/758
(58) Field of Classification Search
USPC .......... 341/118–155; 714/700, 748–758, 792, 714/776
See application file for complete search history.

(56) References Cited

U.S. PATENT DOCUMENTS

| | | | |
|---|---|---|---|
| 5,309,157 A * | 5/1994 | Yee | 341/156 |
| 5,341,137 A * | 8/1994 | Yee | 341/156 |
| 6,738,949 B2 * | 5/2004 | Senda et al. | 714/796 |
| 6,985,097 B2 * | 1/2006 | Ueno et al. | 341/118 |
| 7,088,147 B2 * | 8/2006 | Prasad et al. | 327/91 |

(Continued)

FOREIGN PATENT DOCUMENTS

JP    2008-131298 A    6/2008

OTHER PUBLICATIONS

Yuji Nakajima, et al., A Background Self-Calibrated 6b 2.7 GS/s ADC With Cascade-Calibrated Folding-Interpolating Architecture, IEEE Journal of Solid-State Circuits, Apr. 2010, pp. 707-718, vol. 45, No. 4.

(Continued)

*Primary Examiner* — Lam T Mai
(74) *Attorney, Agent, or Firm* — Sughrue Mion, PLLC

(57) ABSTRACT

An A/D conversion unit performs an A/D conversion operation twice during a hold period of an analog value. In a first conversion operation, the A/D conversion unit compares the analog value with a first reference voltage and outputs a comparison result as first converted data. In a second conversion operation, the A/D conversion unit compares the analog value with a second reference voltage and outputs a comparison result as second converted data. The second reference voltage is a voltage obtained by adding or subtracting a minimum resolution voltage to or from the first reference voltage. A digital processing unit averages errors of the first and second converted data by digital processing to detect an A/D conversion error, and feeds back a detection result to the A/D conversion unit as a control value to perform voltage control.

10 Claims, 9 Drawing Sheets

(56) References Cited

U.S. PATENT DOCUMENTS

| | | | | |
|---|---|---|---|---|
| 7,106,240 | B2 * | 9/2006 | Cringean | 341/163 |
| 7,148,831 | B2 * | 12/2006 | Krymski | 341/155 |
| 7,274,319 | B2 * | 9/2007 | Lee | 341/155 |
| 7,474,237 | B2 * | 1/2009 | Tsividis | 341/118 |
| 7,495,589 | B1 * | 2/2009 | Trifonov et al. | 341/118 |
| 7,688,242 | B2 * | 3/2010 | Shimizu et al. | 341/155 |
| 8,010,864 | B2 * | 8/2011 | Tang | 714/752 |
| 8,081,097 | B2 * | 12/2011 | Hsu | 341/120 |

OTHER PUBLICATIONS

Yuji Nakajima, et al., "A Self-Background Calibrated 6b 2.7GS/s ADC with Cascade-Calibrated Folding-Interpolating Architecture", IEEE 2009 Symposium on VLSI Circuits Digest of Technical Papers, 2009, pp. 266-267.

* cited by examiner

A/D CONVERSION DEVICE AND A/D CONVERSION CORRECTING METHOD

TECHNICAL FIELD

This invention relates to an A/D conversion device and an A/D conversion correcting method therefor.

BACKGROUND ART

In recent years, a digital technology has made an outstanding progress, which is accompanied by an increasing demand for enhanced precision of an A (analog)/D (digital) conversion device that converts an analog signal into a digital signal.

As literatures showing examples in which an A/D conversion circuit is corrected simultaneously with continuous A/D conversion, there are Patent Literature 1 and Non Patent Literature 1.

As illustrated in FIG. 1, an A/D conversion device described in Patent Literature 1 includes at least two A/D conversion circuits ADC1 and ADC2, and performs calibration through the use of a reference voltage signal generated in a reference voltage generation unit 10. For example, when one A/D conversion circuit ADC1 is connected to an analog input signal AIS by a switching circuit 11 operating under the control of a control unit 1, the other A/D conversion circuit ADC2 is connected to a reference voltage generation unit 10. When such switching is performed at a predetermined time interval, the two A/D conversion circuits ADC1 and ADC2 alternately convert the analog input signal AIS and the reference voltage signal from the reference voltage generation unit 10. The control unit 1 causes a storage unit 12 to store an average value of conversion characteristics information based on digital values converted by the A/D conversion circuits (converted digital values with respect to the reference voltage signal). A digital processing circuit 13 corrects a converted value through the use of the average value of the converted digital values obtained as described above, to thereby enhance precision of correction to the A/D conversion circuits ADC1 and ADC2. The digital processing circuit 13 outputs a corrected digital output signal DOS.

Next, an entire configuration and a calibration method of an A/D conversion device described in Non Patent Literature 1 are described with reference to FIGS. 2 and 3A to 3C.

The A/D conversion device described in Non Patent Literature 1 includes two A/D conversion circuits 20A and 20B, and reference voltage generation circuits respectively combined with the A/D conversion circuits 20A and 20B. One of the A/D conversion circuits, herein, the A/D conversion circuit 20A, includes a preamplifier unit 21A formed of a plurality of preamplifiers, and a comparator unit 25A formed of a plurality of comparators corresponding to the plurality of preamplifiers. A resistor column 22A formed of a plurality of resistors R, R0, R1, R2, . . . , R8 connected in series is connected to the A/D conversion circuit 20A. A negative potential −Vref of a reference voltage source is connected to one end side of the resistor column 22A, and a positive potential +Vref of the reference voltage source is connected to the other end side of the resistor column 22A. Thus, voltages (different values) generated by voltage dividing are input to one input terminal of each preamplifier from a connection point (node) between the resistors R0 and R1, a connection point between the resistors R1 and R2, . . . , a connection point between the resistors R7 (not shown) and R8. More specifically, the resistor column 22A and the reference voltage source that applies the negative potential −Vref and the positive potential +Vref as reference voltages function as a reference voltage generation unit. The analog input signal AIS is input to the other input terminal of each preamplifier.

The other A/D conversion circuit, herein, the A/D conversion circuit 20B, also has the same configuration (preamplifier unit 21B, comparator unit 25B) as that of the A/D conversion circuit 20A. However, the reference voltage generation circuit on the A/D conversion circuit 20B side has a function of applying a voltage shifted by 1LSB (least significant bit) with respect to the negative potential −Vref and the positive potential +Vref. Therefore, switches 24-1 and 24-2 for switching terminals A and B are respectively connected to one end side and the other end side of a resistor column 22B formed of a plurality of resistors R0, R1, R2, . . . , R8 connected in series. Further, when the switches 24-1 and 24-2 are placed on the terminal A side, the positive potential +Vref and the negative potential −Vref of the reference voltage source are connected to both ends of the resistor column 22B, and the resistors R is connected in series to the negative potential side end portion of the resistor column 22B. On the other hand, when the switches 24-1 and 24-2 are placed on the terminal B side, a positive potential +Vref+1LSB and a negative potential −Vref+1LSB of another reference voltage source are connected to both ends of the resistor column 22B, and the resistor R is connected in series to the positive potential side end portion of the resistor column 22B.

Note that, each of the preamplifiers connected to the input sides of the respective comparators can perform adjustment of an output offset.

A digital processing unit 26 subjects outputs of the plurality of comparators to digital processing and outputs digital values as a digital output signal DOS.

A calibration method is performed as follows. The same analog input signal AIS is converted simultaneously by the two A/D conversion circuits 20A and 20B, to thereby make calibration based on the non-correlation of both pieces of the output data. For example, it is assumed that output signals of the A/D conversion circuits 20A and 20B are different pieces of converted data due to fluctuations between circuits or the like (FIG. 3A). In this case, a threshold value of a comparator is adjusted equivalently by adjusting an output offset of one preamplifier of the A/D conversion circuits 20A and 20B. Pieces of the converted data output from the A/D conversion circuits 20A and 20B are matched through the above-mentioned adjustment. However, the linearity of A/D conversion cannot be corrected only by these adjustments, and hence, a step of the relation with a digital output code converted with respect to an analog input voltage does not have an equal interval but has non-linear characteristics, which does not mean that calibration has been made (FIG. 3B).

Then, the switches 24-1 and 24-2 are switched so as to change the reference voltage to be applied to the other A/D conversion circuit 20B by 1LSB, and data conversion (A/D conversion) is performed based on the reference voltage shifted by 1LSB (one step). Data conversion is repeated under two conditions, in which the reference voltage is not shifted and the reference voltage is shifted. At this time, two pieces of the output data obtained by comparison with two reference voltages have no correlation, and the digital processing unit 26 performs averaging based on the two pieces of the converted data and also performs compensation for linearity precision successively. At this time, during the compensation, the above-mentioned output offset adjustment of a preamplifier of the comparator is used. Then, during the data conversion, two conversion errors are reduced by averaging (FIG. 3C).

Patent Literature 1: Japanese Unexamined Patent Application Publication (JP-A) No. 2008-131298

Non Patent Literature 1: Yuji Nakajima, Akemi Sakaguchi, Toshio Ohkido, Tetsuya Matsumoto, and Michio Yotsuyanagi, "A Self-Background Calibrated 6b 2.7 GS/s ADC with Cascade-Calibrated Folding-Interpolating Architecture" IEEE 2009 Symposium on VLSI Circuits, pp 266-267 (2009)

DISCLOSURE OF THE INVENTION

Problem to be Solved by the Invention

The A/D conversion device described in Patent Literature 1 or Non Patent Literature 1 can calibrate an A/D conversion circuit simultaneously with continuous A/D conversion. However, a plurality of A/D conversion circuits are required, which leads to an increase in power consumption of the entire A/D conversion device and a circuit area thereof.

This invention has been made in view of the above-mentioned problems, and is to provide an A/D conversion device capable of calibrating an A/D conversion circuit simultaneously when A/D conversion is performed continuously, without providing a plurality of A/D conversion circuits.

Means to Solve the Problem

According to a first aspect of this invention, there is provided an A/D conversion device, including: a sample-and-hold unit that samples an analog value of an analog input signal and holds the analog value for a predetermined period of time; an A/D conversion unit that converts an analog input voltage from the sample-and-hold unit into a digital output; a reference voltage generation unit that applies one of a first reference voltage and a second reference voltage to the A/D conversion unit; and a digital processing unit having a function of reading the digital output, determining a control value for correcting the digital output, and outputting the control value to the A/D conversion unit. In the A/D conversion device, the A/D conversion unit performs an operation of converting an analog value into a digital value twice during a hold period of the analog value. In a first conversion operation, the A/D conversion unit compares the analog value with the first reference voltage and outputs a comparison result as first converted data, and in a second conversion operation, the A/D conversion unit compares the analog value with the second reference voltage and outputs a comparison result as second converted data. The second reference voltage is set to a voltage obtained by adding or subtracting a minimum resolution voltage to or from the first reference voltage. The digital processing unit averages errors of the first and second converted data by digital processing to detect an A/D conversion error, feeds back a detection result to the A/D conversion unit as the control value to perform voltage control, and repeats the operation. Thus, the conversion error is reduced.

According to a second aspect of this invention, there is provided an A/D conversion correcting method for an A/D conversion device, the A/D conversion device including: a sample-and-hold unit that samples an analog value of an analog input signal and holds the analog value for a predetermined period of time; an A/D conversion unit that converts an analog input voltage from the sample-and-hold unit into a digital output; and a digital processing unit having a function of reading the digital output, determining a control value for correcting the digital output, and outputting the control value to the A/D conversion unit. In the A/D conversion correcting method, an operation of converting an analog value into a digital value is performed twice during a hold period of the analog value. In a first conversion operation, the analog value is compared with a first reference voltage, and a comparison result is output as first converted data. In a second conversion operation, the analog value is compared with a second reference voltage, and a comparison result is output as second converted data. The second reference voltage is set to a voltage obtained by adding or subtracting a minimum resolution voltage to or from the first reference voltage. Errors of the first and second converted data are averaged by digital processing to detect an A/D conversion error. A detection result is fed back to the A/D conversion unit as the control value to perform voltage control, and the operation is repeated. Thus, the conversion error is reduced.

Effect of the Invention

According to this invention, calibration is made simultaneously with A/D conversion through the use of a single A/D conversion unit, and the circuit area, the processing operation, and power consumption can be reduced.

EMBODIMENTS FOR CARRYING OUT THE INVENTION

Hereinafter, the principle of this invention is described with reference to FIG. 4.

Figure 1:
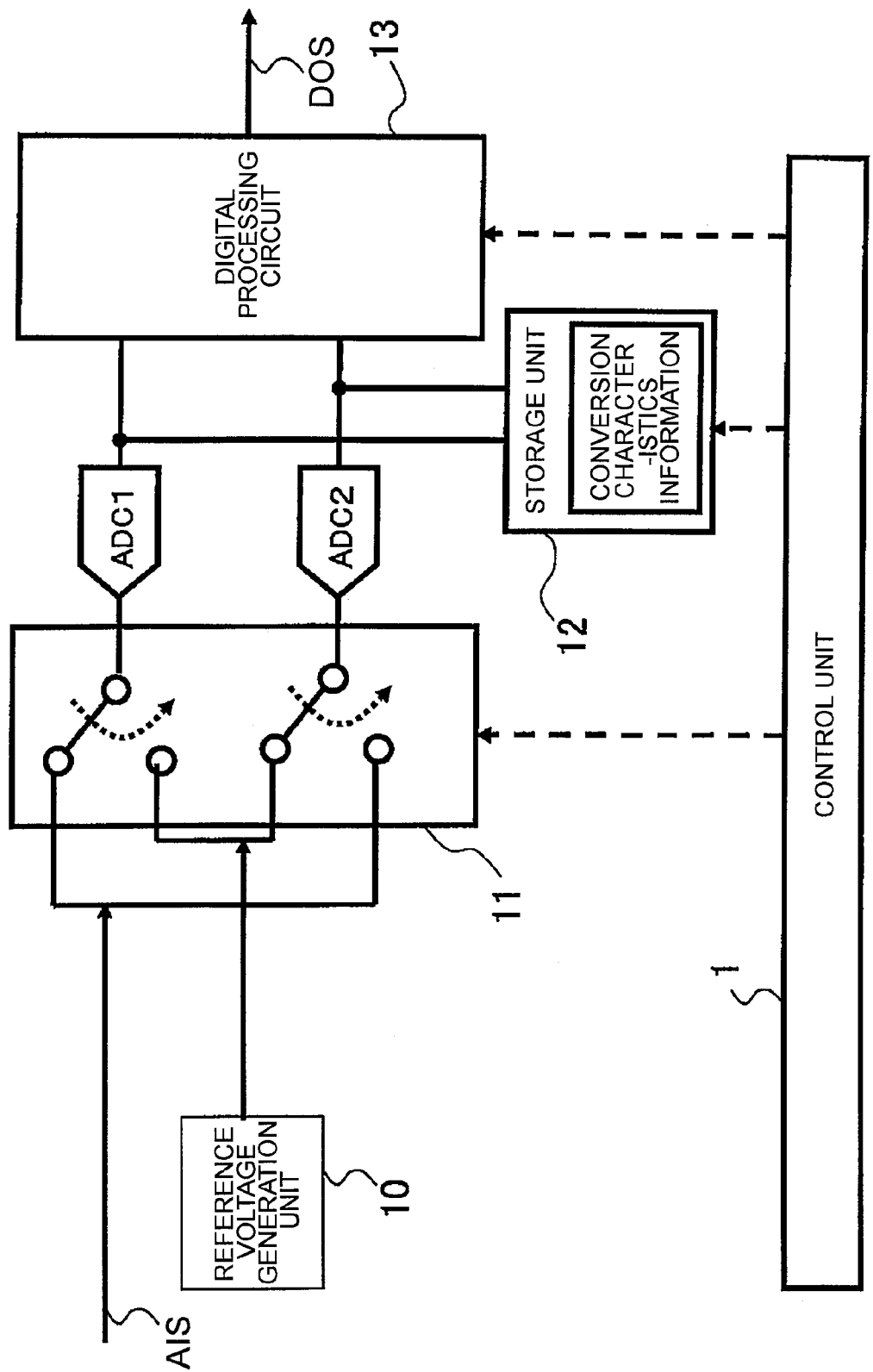
FIG. 1 is a diagram illustrating one example of an A/D conversion device.
Figure 2:
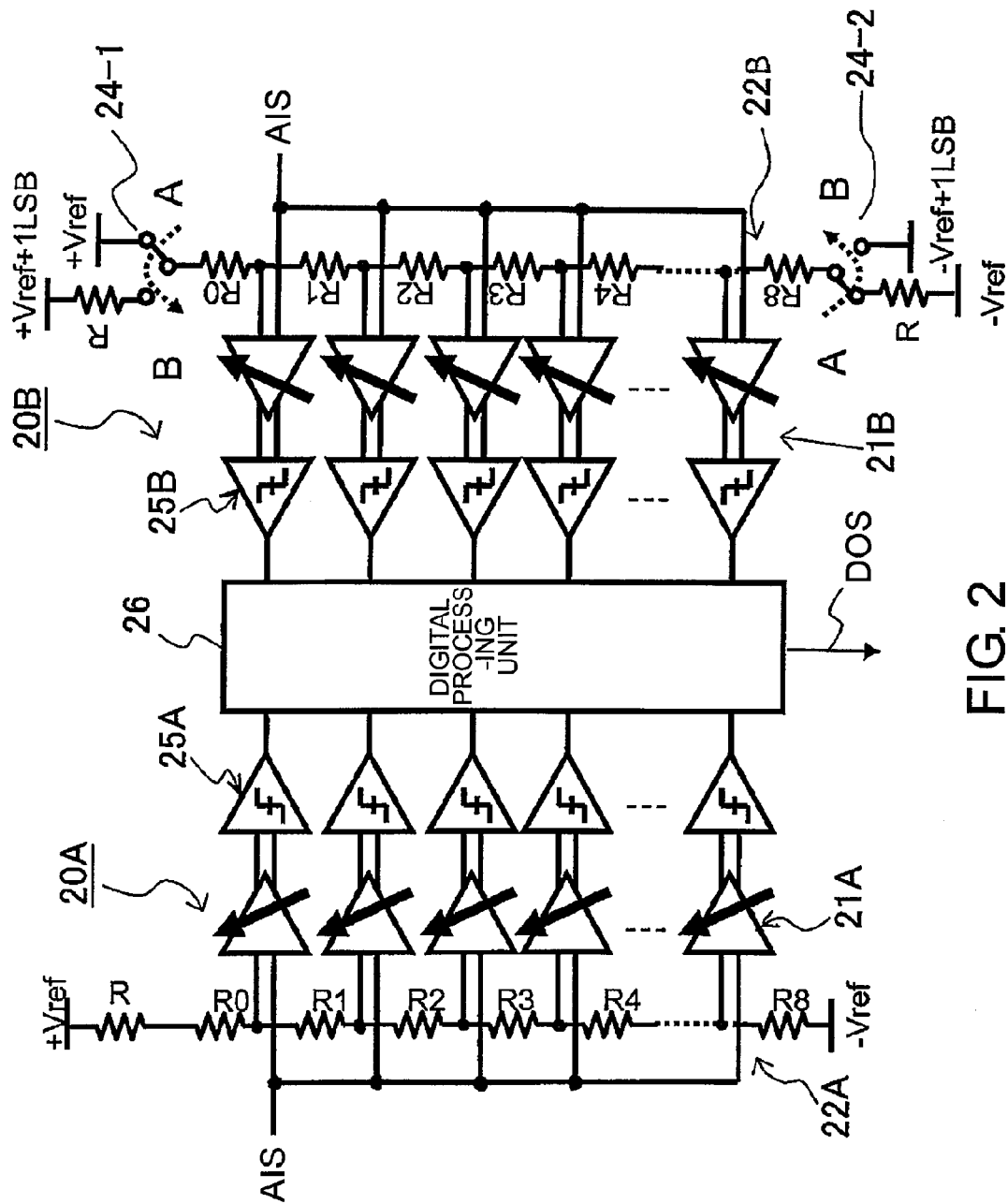
FIG. 2 is a diagram illustrating another example of the A/D conversion device.
Figures 3A, 3B, 3C:
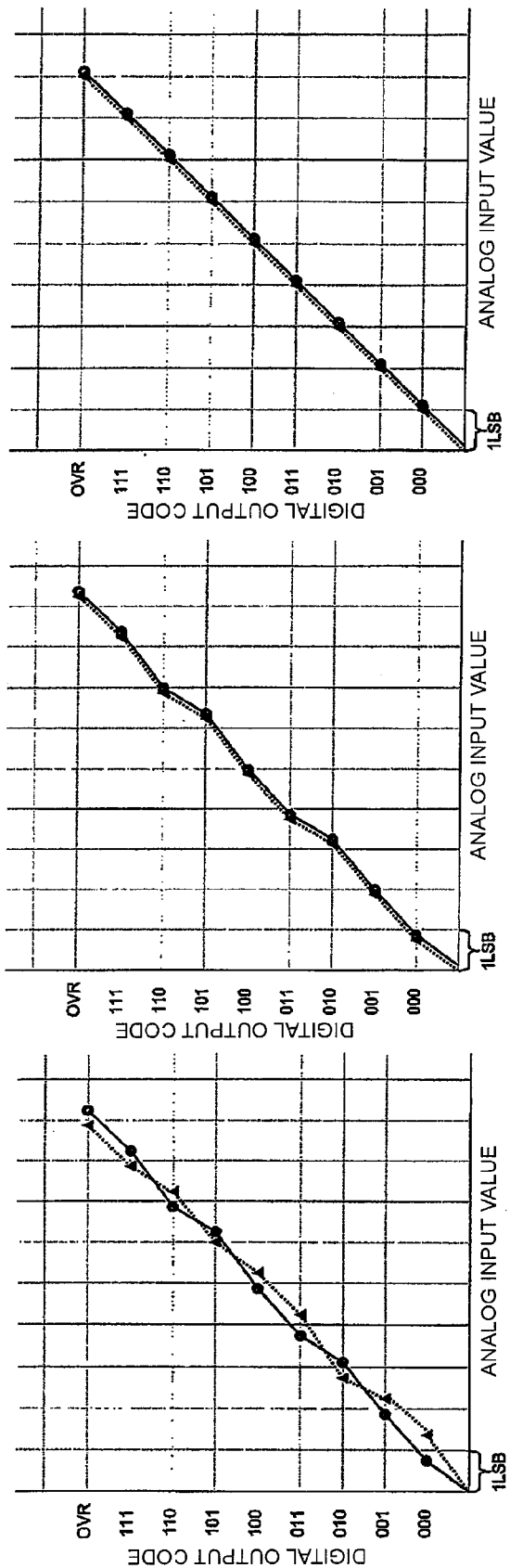
FIGS. 3A to 3C are Characteristics graphs showing an operation of the A/D conversion device illustrated in FIG. 2.
Figure 4:
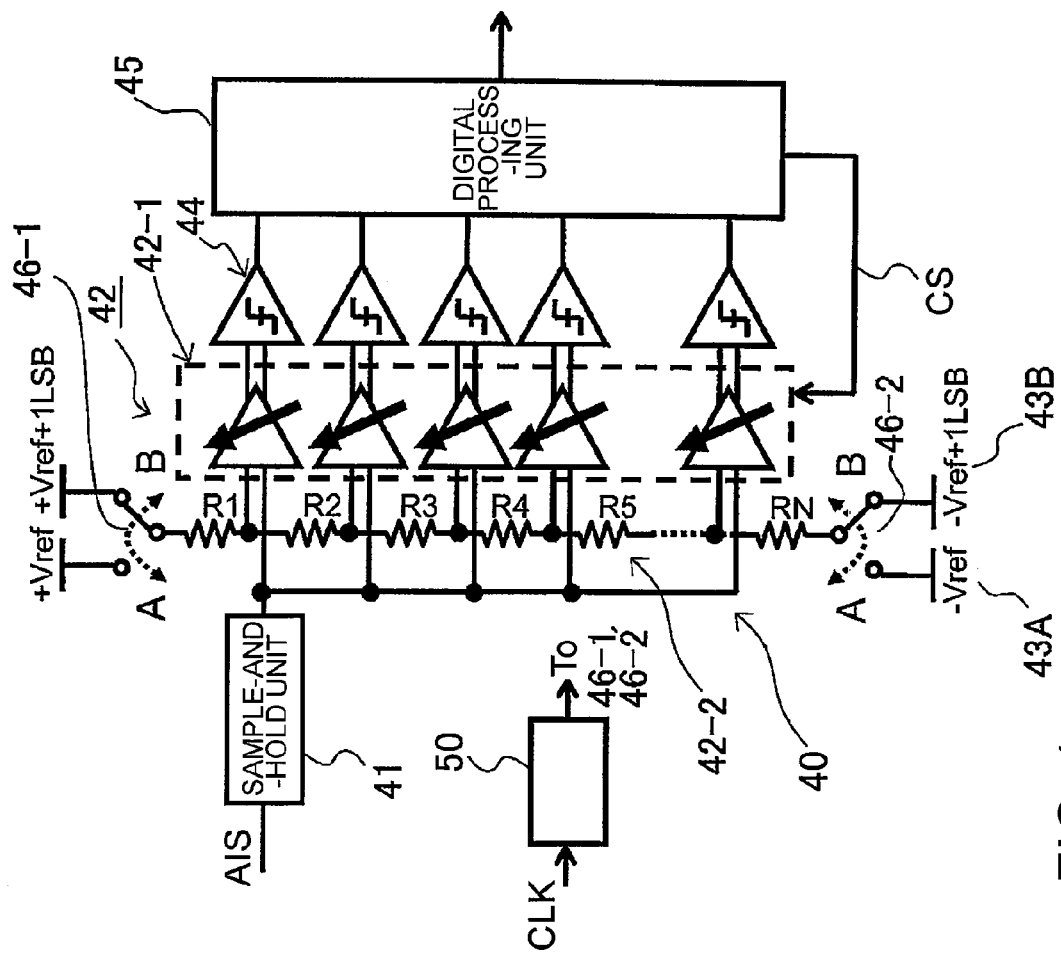
FIG. 4 is a diagram illustrating a configuration of an A/D conversion device according to a first embodiment of this invention.

An A/D conversion device illustrated in FIG. 4 includes an A/D conversion unit (A/D conversion circuit) including a plurality of comparators and a plurality of preamplifiers having a function capable of cancelling offset errors of the plurality of comparators, and a reference voltage generation unit. The reference voltage generation unit has a function of applying a first reference voltage to the A/D conversion unit or applying a voltage obtained by adding or subtracting a voltage of 1LSB to or from the first reference voltage as a second reference voltage. In order to generate the first and second reference voltages, for example, a resistor column (resistor ladder) formed of a plurality of resistors connected in series is used. In this case, a plurality of divided voltages taken out from connection points (nodes) between adjacent resistors in the resistor column are input to the plurality of preamplifiers in the A/D conversion unit. Hereinafter, the plurality of divided voltages to be applied to the A/D conversion unit are collectively referred to as the first reference voltage or the second reference voltage. In the case where there are fluctuations in resistance value among the resistors of the resistor column due to production fluctuations or the like, or in the case where there are fluctuations in threshold value among the comparators for determining "1"/"0" by comparing an analog input voltage with the first and second reference voltages, two pieces of A/D conversion data in the case of using the first reference voltage and in the case of using the second reference voltage may become data converted by the same code instead of the converted data shifted by one code. More specifically, results containing a conversion error may be obtained. A correction value is determined based on the results containing a conversion error.

FIG. 4 is a diagram illustrating the principle of the A/D conversion device according to an embodiment of this invention. The details thereof are described later, and herein, an analog input signal AIS to be input is sampled by a sample-and-hold unit 41, and the value is held for a predetermined period of time (hold period). During the hold period, an A/D conversion unit 42 converts an analog value to digital data twice by comparison with the reference voltages, based on the held analog voltage. The A/D conversion unit 42 performs A/D conversion by comparison with the first reference voltage in the first conversion operation and performs A/D conversion by comparison with a voltage obtained by adding (or subtracting) 1LSB to or from the first reference voltage, i.e., the second reference voltage in the second conversion operation.

Figure 5:
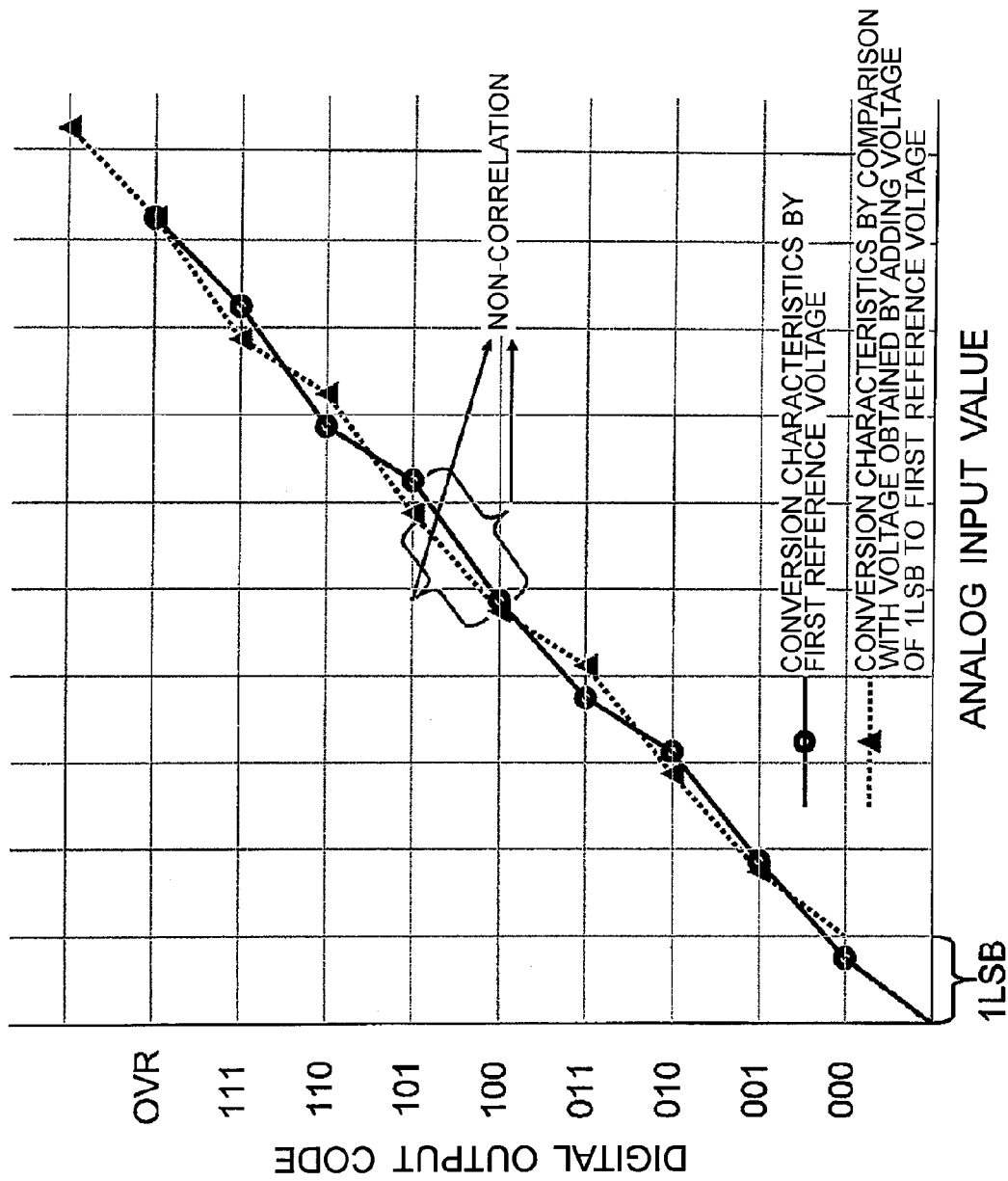
FIG. 5 is a graph showing the operation principle of the A/D conversion device illustrated in FIG. 4.

FIG. 5 shows a relationship between an analog input value and a digital output code at a time when conversion is performed through the use of two reference voltages with respect to an analog value to be input. If there is no fluctuation in resistance of the resistor column for generating the reference voltages, two linear conversion characteristics are obtained. However, generally, there are fluctuations among the plurality of resistors constituting the resistor column for generating the reference voltages, and two non-linear conversion characteristics as shown in FIG. 5 are obtained.

Figure 6:
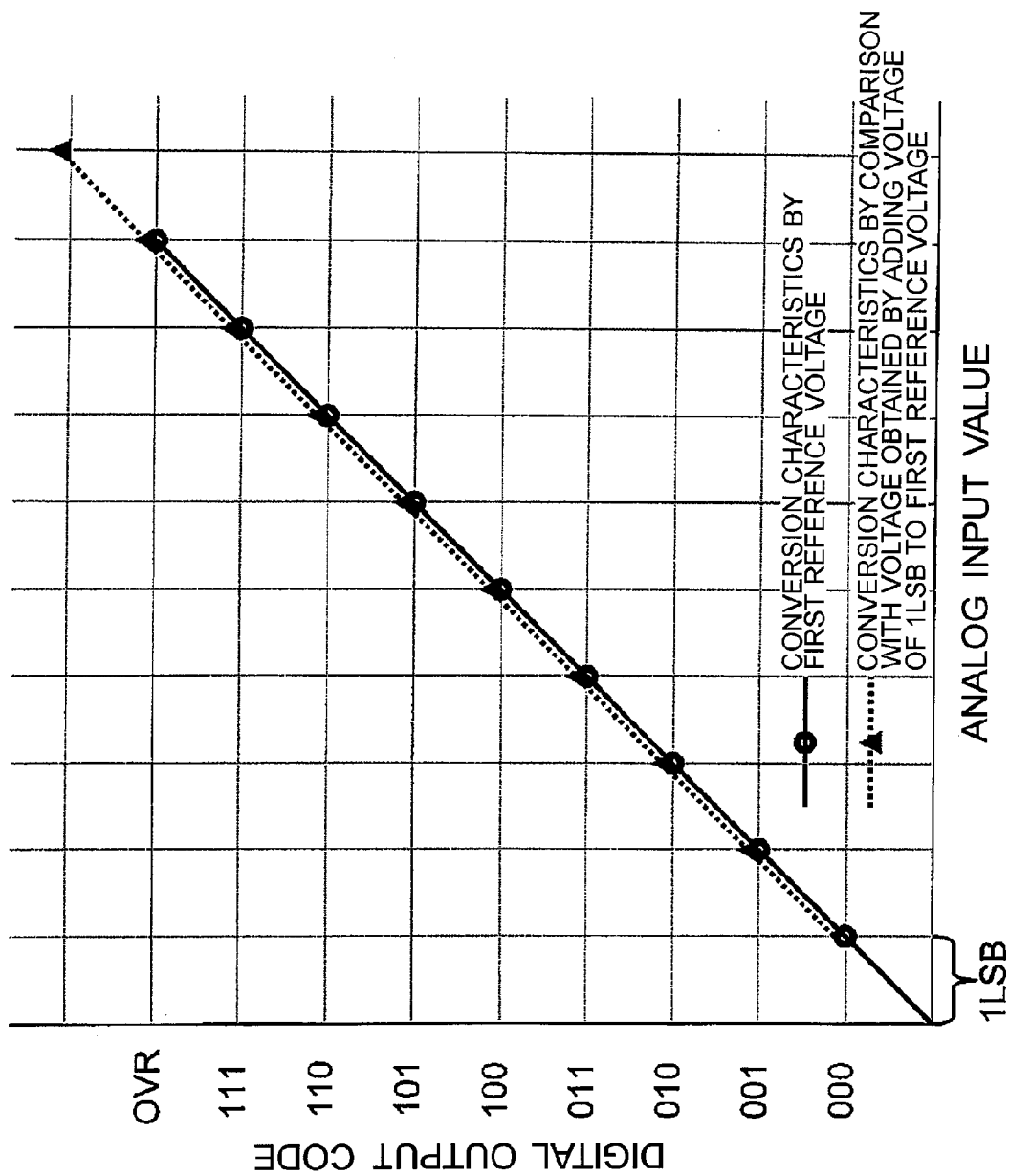
FIG. 6 is a graph showing the operation principle of the A/D conversion device illustrated in FIG. 4.

In FIG. 5, one of the two non-linear conversion characteristics indicates the first conversion characteristics by a given reference voltage (first reference voltage) as represented by filled circles, and the other indicates the second conversion characteristics by the comparison with a voltage obtained by adding a voltage of 1LSB to the given reference voltage (second reference voltage) as represented by filled triangles. Although the two conversion characteristics are shifted by 1LSB, the characteristics have non-linear characteristics equivalent to each other. Thus, regarding two pieces of the converted data obtained by comparison with the two reference voltages, if there is no conversion error in A/D conversion, the second conversion result is supposed to change to a code adjacent by 1LSB with respect to the first conversion result. However, if there is a conversion error, the two pieces of the converted data have no correlation, shifted by one code from desired one (converted data shifted by 1SLB). Two pieces of the output data have no correlation, and hence the two pieces of the output data are averaged and converted repeatedly to perform compensation for the two pieces of the output data. In this manner, a conversion error in the A/D conversion unit can be reduced as shown in FIG. 6.

Figure 7:
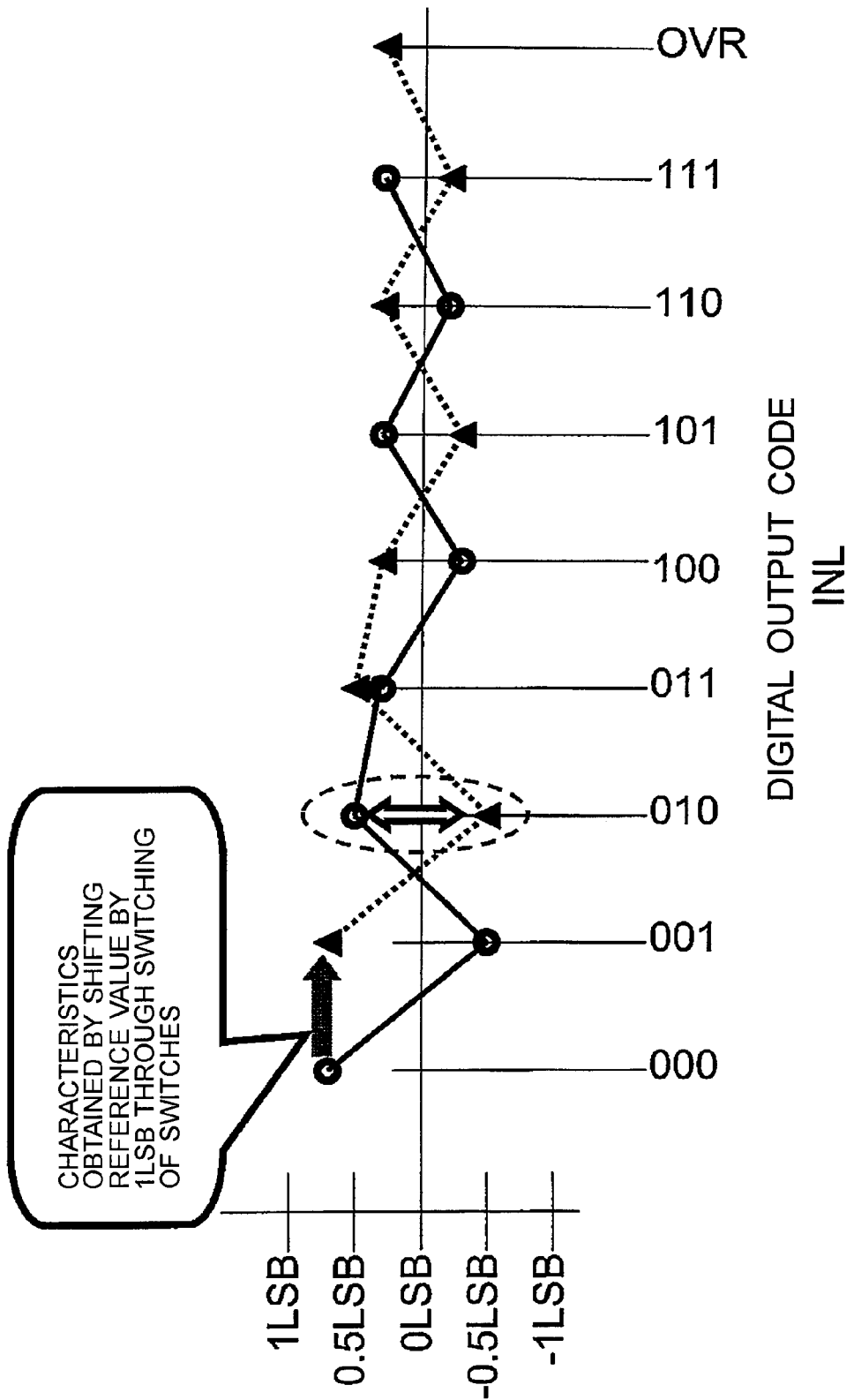
FIG. 7 is a graph showing the operation of the A/D conversion device illustrated in FIG. 4.

FIG. 7 shows integral nonlinearity of two pieces of output data. As is understood from FIG. 7, two pieces of the output data present on the same digital output code have no correlation. This means that two converted data errors on the same digital output code have no correlation, and hence an error is reduced by averaging. Through the use of the above-mentioned procedure, a single A/D conversion unit can simultaneously calibrate a conversion unit that is performing A/D conversion continuously, which cannot be achieved in the conventional example. Consequently, the processing operation and power consumption as well as the circuit area are alleviated compared with the conventional example.

Figure 8:
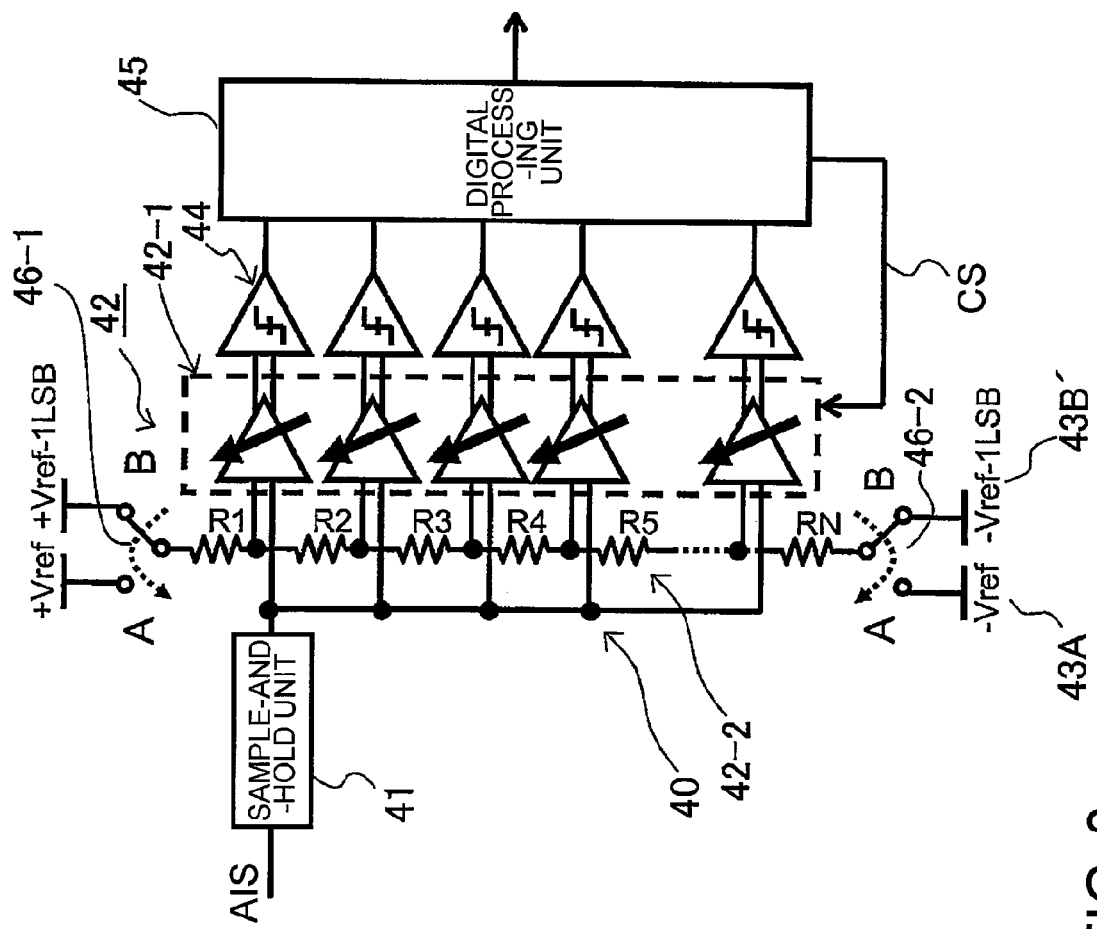
FIG. 8 is a diagram illustrating a configuration of an A/D conversion device according to a second embodiment of this invention.
Figure 9:
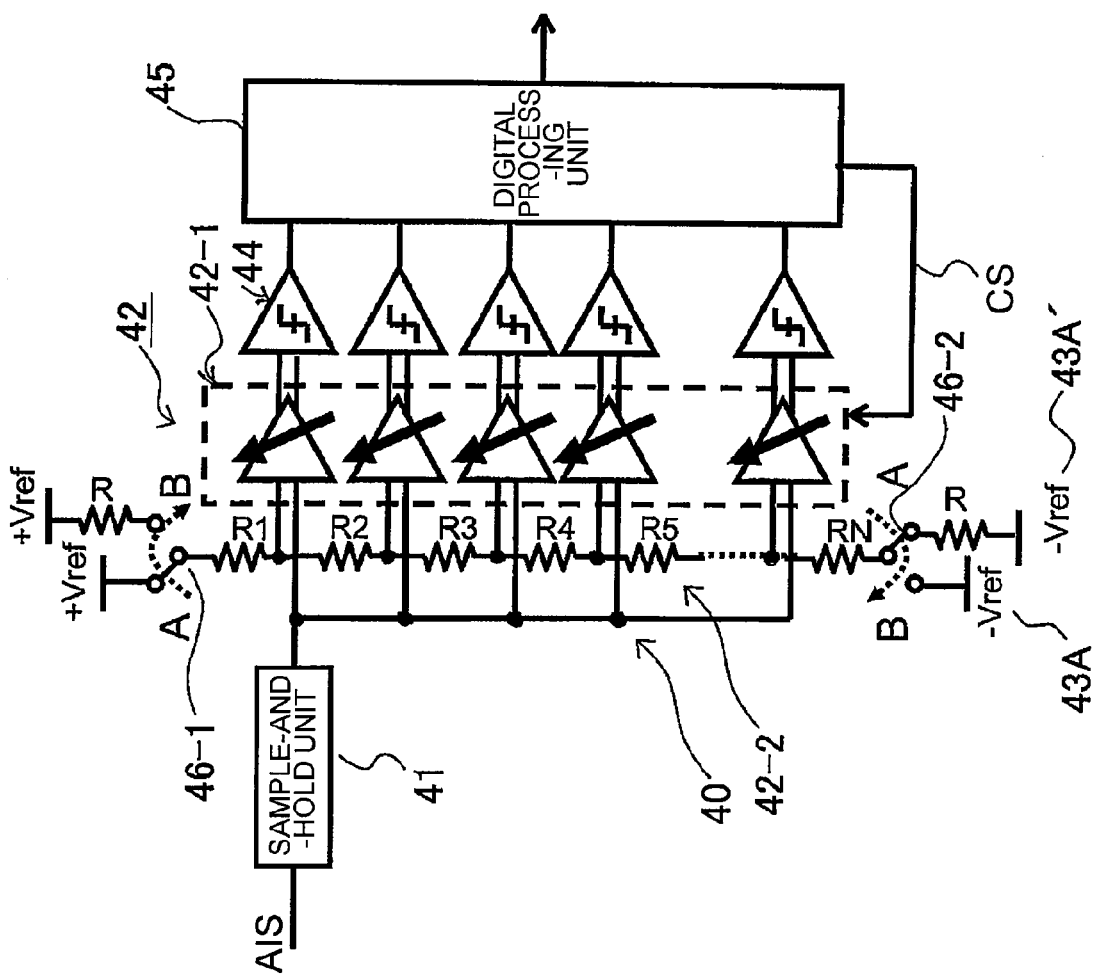
FIG. 9 is a diagram illustrating a configuration of an A/D conversion device according to a third embodiment of this invention.

Hereinafter, this invention is described by way of specific embodiments. In FIGS. 4, 8, and 9, the same components are denoted by the same reference symbols, and the detailed descriptions thereof are omitted. Note that, this invention is not limited to the following individual embodiments.

First Embodiment

FIG. 4 is a block diagram illustrating an A/D conversion device according to a first embodiment of this invention.

The A/D conversion device according to the first embodiment includes a sample-and-hold unit 41 that samples an analog value of an analog input signal AIS and holds the analog value for a predetermined period of time, and an A/D conversion unit (A/D conversion circuit) 42 that converts the held analog input voltage into a digital output. The A/D conversion device further includes a reference voltage generation unit 40 including a resistor column 42-2 and two reference voltage sources 43A and 43B, and a digital processing unit 45. The digital processing unit 45 reads the digital output of the A/D conversion unit 42, determines a control value for correcting the digital output, and outputs the control value to each preamplifier of a preamplifier unit 42-1 as a control signal CS.

The A/D conversion unit 42 includes the preamplifier unit 42-1 formed of (N−1) (N is an integer of 2 or more) preamplifiers and a comparator unit 44 formed of (N−1) comparators corresponding to the (N−1) preamplifiers. Each of the preamplifiers receives an analog voltage from the sample-and-hold unit 41 at one of its two inputs and receives a divided voltage from the resistor column at the other of the two inputs. The preamplifiers connected to a front stage of the comparators cancel an offset error of each comparator of the comparator unit 44 by adjusting an output offset, as described above. The reference voltage generation unit 40 includes the resistor column 42-2 formed of a series circuit of N resistors R1 to RN, for generating, as reference voltages, divided voltages corresponding to the (N−1) comparators. The resistance values of the resistors R1 to RN may be assumed to be equal to each other if fluctuations thereof are neglected.

Switches 46-1 and 46-2 that switch Settings A and B are connected respectively to both ends of the resistor column 42-2. When the switches 46-1 and 46-2 are placed on a contact A side, a positive potential (high potential) +Vref and a negative potential (low potential) −Vref of a reference voltage source (first reference voltage source 43A) are connected to both ends of the resistor column 42-2. On the other hand, when the switches 46-1 and 46-2 are placed on a terminal B side, a positive potential +Vref+1LSB and a negative potential −Vref+1LSB of another reference voltage source (second reference voltage source 43B) are connected to both ends of the resistor column 42-2.

When the positive potential +Vref and the negative potential −Vref are applied from the first reference voltage source 43A to both ends of the resistor column 42-2 by the switches 46-1 and 46-2, the resistor column 42-2 generates a first reference voltage (a plurality of divided voltages) to supply the first reference voltage to each preamplifier of the preamplifier unit 42-1. As described above, strictly speaking, the first reference voltage has (N−1) kinds of divided voltage values determined by dividing the positive potential +Vref to the negative potential −Vref by the N resistors R1 to RN. On the other hand, when the positive potential (+Vref+1LSB) and the negative potential (−Vref+1LSB) are applied from the second reference voltage source 43B to both sides of the resistor column 42-2 by the switches 46-1 and 46-2, the resistor column 42-2 generates a second reference voltage (a plurality of divided voltages) to supply the second reference voltage to each comparator of the preamplifier unit 42-1. The second reference voltage has (N−1) kinds of divided voltage values determined by dividing the positive potential (+Vref+1LSB) to the negative potential (−Vref+1LSB) by the resistors R1 to RN. In other words, the second reference voltage in the first embodiment is a potential obtained by adding a minimum resolution (1LSB) potential to the first reference voltage.

The sample-and-hold unit 41 samples an analog voltage to be input and holds the analog voltage for a predetermined period of time. The A/D conversion unit 42 converts an analog value into a digital value twice during the above-mentioned analog value hold period. In the first conversion operation, the switches 46-1 and 46-2 are switched to the terminal A side, and the comparator unit 44 compares the analog voltage with the first reference voltage and converts the analog value into the digital value. In the second conversion operation, the switches 46-1 and 46-2 are switched to the terminal B side, and the comparator 44 compares the analog voltage with the second reference voltage, i.e., the potential obtained by adding the minimum resolution (1LSB) potential to the first reference voltage, and converts the analog value into the digital value.

At this time, even when an error occurs, two pieces of the converted data have no correlation, and hence the errors of the two pieces of the converted data are averaged by digital processing in the digital processing unit 45. Thus, the digital processing unit 45 detects an A/D conversion error, feeds back the detection result to the preamplifier unit 42-1 as the control signal CS, and performs analog voltage control so that offsets of the comparators are cancelled. The digital processing unit 45 reduces the A/D conversion error by repeating this operation.

Note that, the switching of the switches 46-1 and 46-2 is performed during the hold period of the sample-and-hold unit 41 through the use of a sampling clock in the sample-and-hold unit 41. For example, assuming that the whole sample-and-hold period is 100%, a sampling period is set to 50%, a first hold period is set to 25%, and a second hold period is set to 25%, and the switching of the switches 46-1 and 46-2 is performed at a time of switching from the first hold period to the second hold period. The switching control is performed by a control unit 50 to which at least a sampling clock CLK is input.

Note that, the analog voltage control of the preamplifier 42-1 by the digital processing unit 45 and the switching control of the switches 46-1 and 46-2 by the control unit 50 are performed in a similar manner also in second and third embodiments described later.

Second Embodiment

FIG. 8 is a block diagram illustrating an A/D conversion device according to the second embodiment of this invention.

The second embodiment is different from the first embodiment in that a second reference voltage source 43B' of the reference voltage generation unit 40 applies a positive potential (+Vref−1LSB) and a negative potential (−Vref−1LSB) to the A/D conversion unit 42 as a second reference voltage.

Thus, the second reference voltage in the second embodiment has (N−1) kinds of divided voltage values determined by dividing the positive potential (+Vref−1LSB) to the negative potential (−Vref−1LSB) by the resistors R1 to RN. More specifically, the second reference voltage in the second embodiment is a potential obtained by subtracting a minimum resolution (1LSB) potential from the first reference voltage.

The A/D conversion device according to the second embodiment includes a sample-and-hold unit 41 that samples an analog value and holds the analog value for a predetermined period of time, a reference voltage generation unit 40, an A/D conversion unit 42 that converts an analog input voltage into a digital output, and a digital processing unit 45 that reads the digital output from the A/D conversion unit 42, determines a control value for correcting the digital output, and outputs the control value to the preamplifier unit 42-1 as a control signal CS.

The sample-and-hold unit 41 samples an analog voltage to be input and holds the analog voltage for a predetermined period of time. The A/D conversion unit 42 converts an analog value into a digital value twice during the above-mentioned analog value hold period. In the first conversion operation, the switches 46-1 and 46-2 are switched to the terminal A side, and each comparator of the A/D conversion unit 42 compares the analog voltage with the corresponding first reference voltage (divided voltage). Then, the digital processing unit 45 subjects the comparison result to digital processing, thereby converting the analog value into the digital value.

Next, in the second conversion operation, the switches 46-1 and 46-2 are switched to the terminal B side, and the comparator 44 of the A/D conversion unit 42 compares the analog voltage with the second reference voltage, i.e., the potential obtained by subtracting the minimum resolution (1LSB) potential from the first reference voltage, and converts the analog value into the digital value. At this time, even when an error occurs, two pieces of the converted data have no correlation. Therefore, the digital processing unit 45 averages errors of the two pieces of the converted data by digital processing to detect the A/D conversion error, and feeds back the detection result to the A/D conversion unit 42 (preamplifier unit 42-1) as the control signal CS, thereby performing the above-mentioned analog voltage control. The digital processing unit 45 reduces a conversion error by repeating this operation.

Third Embodiment

FIG. 9 is a block diagram illustrating an A/D conversion device according to the third embodiment of this invention.

The third embodiment is different from the first embodiment in that both the reference voltage sources 43A and 43A' have a positive potential +Vref and a negative potential −Vref. In other words, the number of the reference voltage sources may be one. Further, on the switch 46-1 side to which the positive potential +Vref is applied, the resistor R is additionally connected to the terminal B side (positive or high potential side end portion of the resistor column 42-2). On the other hand, on the switch 46-2 side to which the negative potential −Vref is applied, the resistor R is additionally connected to the terminal A side (negative or low potential side end portion of the resistor column 42-2). More specifically, when the switches 46-1 and 46-2 are switched to the terminal A side, the resistor R is further connected in series to the negative potential side of the resistor column 42-2, and when the switches 46-1 and 46-2 are switched to the terminal B side, the resistor R is further connected in series to the positive potential side of the resistor column 42-2. The resistance values of the resistors R1 to RN, and R may be assumed to be equal to each other if fluctuations are neglected.

The sample-and-hold unit 41 samples an analog voltage to be input and holds the analog voltage for a predetermined period of time. The A/D conversion unit 42 converts an analog value into a digital value twice during the above-mentioned analog value hold period. In the first conversion operation, the switches 46-1 and 46-2 are switched to the terminal A side, and the comparator unit 44 compares the analog voltage with a first reference voltage, and converts the analog value into the digital value. Next, in the second conversion operation, the switches 46-1 and 46-2 are switched to the terminal B side. Then, a divided voltage as a second reference voltage obtained by subtracting a minimum resolution potential from the first reference voltage is applied to a node between the respective resistors. The comparator unit 44 compares the analog voltage with the voltage obtained by subtracting the minimum resolution (1LSB) potential from the first reference voltage to perform A/D conversion.

For example, description is made using a voltage to be input to a preamplifier present in the uppermost part of FIG. 9. In the case where the switches 46-1 and 46-2 are placed on the terminal A side, the above-mentioned preamplifier is applied with a divided voltage (first reference voltage) defined by $\{(1/9) \times [(+Vref)-(-Vref)]\}$. On the other hand, in the case where the switches 46-1 and 46-2 are placed on the terminal B side, the above-mentioned preamplifier is applied with a divided voltage (second reference voltage) defined by $\{(2/9) \times [(+Vref)-(-Vref)]\}$. As a result, A/D conversion is performed with a value (minimum resolution or 1LSB) shifted by a voltage of 1/9 of $[(+Vref)-(-Vref)]\}$ between the case where the switches 46-1 and 46-2 are placed on the terminal A side and the case where the switches 46-1 and 46-2 are placed on the terminal B side.

At this time, even when an error occurs, two pieces of the converted data have no correlation. Therefore, the errors of the two pieces of the converted data are averaged by digital processing in the digital processing unit 45. The digital processing unit 45 detects the above-mentioned A/D conversion error, and feeds back the detection result to the A/D conversion unit 42 (preamplifier unit 42-1) through a control signal line as a control signal CS, thereby performing analog voltage control. The digital processing unit 45 reduces a conversion error by repeating this operation.

Effects of Embodiments

As described above, according to the above-mentioned embodiments, regarding two pieces of A/D converted data obtained by comparison with two reference voltages, if there is no conversion error in A/D conversion, another conversion result is supposed to change to a code adjacent by 1LSB. However, if there is a conversion error, two pieces of converted data have no correlation, shifted by one code from desired one (converted data shifted by 1LSB). Two pieces of the output data have no correlation, and hence the two pieces of the output data are averaged and converted repeatedly to perform compensation of the two pieces of the converted data. Thus, a conversion error of the A/D conversion unit can be reduced (see FIG. 6).

FIG. 7 shows integral nonlinearity of two pieces of output data. As is understood from FIG. 7, two pieces of converted data present on the same digital output code have no correlation. Through the use of the above-mentioned procedure, a single A/D conversion unit can simultaneously make calibration while performing A/D conversion continuously, which cannot be achieved in the conventional example. Consequently, the processing operation and power consumption as well as the circuit area are alleviated compared with the conventional example.

This invention has been described by way of a plurality of embodiments. However, this invention is not limited to the above-mentioned embodiments. The configuration and details of this invention can be variously modified within the spirit and scope of this invention described in the claims so that those skilled in the art can understand the modifications.

This application claims priority from Japanese Patent Application No. 2010-026068, filed on Feb. 9, 2010, the entire disclosure of which is incorporated herein by reference.

The invention claimed is:

1. An A/D conversion device, comprising:
   a sample-and-hold unit that samples an analog value of an analog input signal and holds the analog value for a predetermined period of time;
   an A/D conversion unit that converts an analog input voltage from the sample-and-hold unit into a digital output;
   a reference voltage generation unit that applies one of a first reference voltage and a second reference voltage to the A/D conversion unit in a switching manner; and
   a digital processing unit having a function of reading the digital output, determining a control value for correcting the digital output, and outputting the control value to the A/D conversion unit,
   wherein the A/D conversion unit performs an operation of converting an analog value into a digital value twice during a hold period of the analog value, and, in a first conversion operation, the A/D conversion unit compares the analog value with the first reference voltage and outputs a comparison result as first converted data, and in a second conversion operation, the A/D conversion unit compares the analog value with the second reference voltage and outputs a comparison result as second converted data,
   wherein the second reference voltage is set to a voltage obtained by adding or subtracting a minimum resolution voltage to or from the first reference voltage, and
   wherein the digital processing unit averages errors of the first and second converted data by digital processing to detect an A/D conversion error, feeds back a detection result to the A/D conversion unit as the control value to perform voltage control, and repeats the operation to reduce the conversion error.

2. An A/D conversion device according to claim 1, wherein the A/D conversion unit comprises:
   a plurality of comparators; and
   a plurality of preamplifiers connected to each front stage of the plurality of comparators and having a function of cancelling an offset of corresponding one of the plurality of comparators, and
   wherein the control value is fed back to the plurality of preamplifiers to perform voltage control.

3. An A/D conversion device according to claim 2, wherein the reference voltage generation unit comprises:
   a first reference voltage source having a positive potential and a negative potential defining the first reference voltage;
   a second reference voltage source having a positive potential and a negative potential defining the second reference voltage;
   a resistor column including a plurality of resistors connected in series, which is connected to the plurality of preamplifiers; and a switching unit that connects one of the first reference voltage source and the second reference voltage source to both ends of the resistor column.

4. An A/D conversion device according to claim 3,
wherein the second reference voltage source has a positive potential and a negative potential obtained by adding or subtracting the minimum resolution voltage to or from both the positive potential and the negative potential of the first reference voltage source, as the positive potential and the negative potential defining the second reference voltage, and
wherein the switching unit connects the positive potential and the negative potential of the first reference voltage source to the both ends of the resistor column, or connects the positive potential and the negative potential of the second reference voltage source to the both ends of the resistor column.

5. An A/D conversion device according to claim 3,
wherein the second reference voltage source has the same positive potential and the same negative potential as the positive potential and the negative potential of the first reference voltage source, as the positive potential and the negative potential defining the second reference voltage, and
wherein the switching unit connects the positive potential and the negative potential of the first reference voltage source to the both ends of the resistor column and connects another resistor in series to a negative potential side end portion of the resistor column, or connects the positive potential and a negative low potential of the second reference voltage source to the both ends of the resistor column and connects another resistor in series to a positive potential side end portion of the resistor column.

6. An A/D conversion correcting method for an A/D conversion device,
the A/D conversion device comprising:
a sample-and-hold unit that samples an analog value of an analog input signal and holds the analog value for a predetermined period of time;
an A/D conversion unit that converts an analog input voltage from the sample-and-hold unit into a digital output; and
a digital processing unit having a function of reading the digital output, determining a control value for correcting the digital output, and outputting the control value to the A/D conversion unit,
the A/D conversion correcting method comprising:
performing an operation of converting an analog value into a digital value twice during a hold period of the analog value, and, in a first conversion operation, comparing the analog value with a first reference voltage and outputting a comparison result as first converted data, and in a second conversion operation, comparing the analog value with a second reference voltage and outputting a comparison result as second converted data;
setting the second reference voltage to a voltage obtained by adding or subtracting a minimum resolution voltage to or from the first reference voltage; and
averaging errors of the first and second converted data by digital processing to detect an A/D conversion error, feeding back a detection result to the A/D conversion unit as the control value to perform voltage control, and repeating the operation to reduce the conversion error.

7. An A/D conversion correcting method according to claim 6, further comprising:
preparing, in order to constitute the A/D conversion unit, a plurality of comparators and a plurality of preamplifiers connected to each front stage of the plurality of comparators and having a function of cancelling an offset of the respective plurality of comparators; and
feeding back the control value to the plurality of preamplifiers to perform voltage control.

8. An A/D conversion correcting method according to claim 7, further comprising:
preparing:
a first reference voltage source having a positive potential and a negative potential defining the first reference voltage;
a second reference voltage source having a positive potential and a negative potential defining the second reference voltage; and
a resistor column including a plurality of resistors connected in series which are connected to the plurality of preamplifiers; and
connecting one of the first reference voltage source and the second reference voltage source to both ends of the resistor column in a switching manner.

9. An A/D conversion correcting method according to claim 8,
wherein the second reference voltage source has a positive potential and a negative potential obtained by adding or subtracting the minimum resolution voltage to or from both the positive potential and the negative potential of the first reference voltage source, as the positive potential and the negative potential defining the second reference voltage, and
wherein the A/D conversion connecting method further comprises connecting the positive potential and the negative potential of the first reference voltage source to the both ends of the resistor column, or connecting the positive potential and the negative potential of the second reference voltage source to the both ends of the resistor column in a switching manner.

10. An A/D conversion connecting method according to claim 8,
wherein the second reference voltage source has the same positive potential and the same negative potential as the positive potential and the negative potential of the first reference voltage source, as the positive potential and the negative potential defining the second reference voltage, and
wherein the A/D conversion connecting method further comprises connecting the positive potential and the negative potential of the first reference voltage source to the both ends of the resistor column and connects another resistor in series to a negative potential side end portion of the resistor column, or connects the positive potential and a negative low potential of the second reference voltage source to the both ends of the resistor column and connects another resistor in series to a positive potential side end portion of the resistor column in a switching manner.

* * * * *

UNITED STATES PATENT AND TRADEMARK OFFICE
CERTIFICATE OF CORRECTION

PATENT NO. : 8,593,315 B2
APPLICATION NO. : 13/577845
DATED : November 26, 2013
INVENTOR(S) : Tomoyuki Yamase and Hidemi Noguchi It is certified that error appears in the above-identified patent and that said Letters Patent is hereby corrected as shown below:

In the Claims

Col. 12, in Claim 9, line 36, delete "connecting" and insert --correcting--
Col. 12, in Claim 10, line 43, delete "connecting" and insert --correcting--
Col. 12, in Claim 10, line 51, delete "connecting" and insert --correcting--

Signed and Sealed this
Tenth Day of June, 2014

Michelle K. Lee
*Deputy Director of the United States Patent and Trademark Office*